(12) United States Patent
Hawbaker et al.

(10) Patent No.: US 11,432,424 B2
(45) Date of Patent: Aug. 30, 2022

(54) TWO PIECE PANEL LATCH AND METHOD

(71) Applicant: RED LION CONTROLS, INC., York, PA (US)

(72) Inventors: Christopher N. Hawbaker, York, PA (US); Jay C. Schrum, York, PA (US)

(73) Assignee: RED LION CONTROLS, INC., York, PA (US)

( * ) Notice: Subject to any disclaimer, the term of this patent is extended or adjusted under 35 U.S.C. 154(b) by 0 days.

(21) Appl. No.: 17/150,399

(22) Filed: Jan. 15, 2021

(65) Prior Publication Data
US 2022/0232721 A1 Jul. 21, 2022

(51) Int. Cl.
*H05K 7/14* (2006.01)
*H05K 7/18* (2006.01)
*G06F 1/18* (2006.01)

(52) U.S. Cl.
CPC ........... *H05K 7/1408* (2013.01); *G06F 1/186* (2013.01); *H05K 7/1427* (2013.01)

(58) Field of Classification Search
USPC ................ 361/801, 759, 803, 807, 809, 810
See application file for complete search history.

(56) References Cited

U.S. PATENT DOCUMENTS

| | | | |
|---|---|---|---|
| 3,866,302 A | 2/1975 | Gordon et al. | |
| 5,493,475 A * | 2/1996 | Lin | H01L 23/4006 174/16.3 |
| 6,435,882 B1 * | 8/2002 | Pitou | H01R 12/778 439/70 |
| 6,542,369 B1 * | 4/2003 | Wu | H01L 23/4093 174/16.3 |
| 7,280,362 B2 * | 10/2007 | Hood | H01L 23/4093 361/709 |
| 7,438,588 B2 | 10/2008 | Rhodes et al. | |
| 7,639,508 B2 * | 12/2009 | Hauser | H05K 5/0204 361/801 |
| 8,248,786 B2 * | 8/2012 | Cheng | H01L 23/4093 174/16.3 |
| 2004/0077198 A1 | 4/2004 | Schlack | |
| 2004/0190258 A1 * | 9/2004 | Lofland | H01L 23/4093 361/710 |

FOREIGN PATENT DOCUMENTS

| | | |
|---|---|---|
| CA | 2453086 | 2/2008 |
| CN | 201449406 | 5/2010 |

* cited by examiner

*Primary Examiner* — Hung S. Bui
(74) *Attorney, Agent, or Firm* — Potomac Law Group, PLLC (57) ABSTRACT

A method and latch for use with mounting a panel mount module to a panel. The latch includes a housing with a module receiving cavity. The module receiving cavity has cavity walls with projections extending from the cavity walls into the module receiving cavity. The projections are configured to be positioned in openings provided in side walls of the module when the latch is mounted on the module. Securing openings extend through the housing. Mounting hardware is positioned in the securing openings. The securing openings and mounting hardware are configured to be positioned in line with mounting openings in the panel. With the mounting hardware properly secured in the mounting openings of the panel and the projections properly secured in the openings of the module, the module is prevented from movement relative to the panel and any forces applied to the module will be transferred through the latch to the panel.

15 Claims, 7 Drawing Sheets

TWO PIECE PANEL LATCH AND METHOD

FIELD OF THE INVENTION

The present invention is directed a method and a latch for mounting a module to a panel. In particular, the invention is directed to a method and a latch which positively engages the module and the panel to prevent the movement of the latch and the module relative to the panel.

BACKGROUND OF THE INVENTION

Modules and other components are often latched to panels and the like. While the latches cooperate with the modules to retain the modules on the panel, the latches allow movement or slippage between the modules and the panel. As the latches are generally manufactured in one piece to facilitate assembly and minimize parts, the latches do not tightly engage the module, due to the tolerances required to allow the one piece latch to be inserted on the module. Consequently, unwanted forces applied to the module may not be properly transferred to the panel, resulting in damage to the module.

It would, therefore, be beneficial to provide a latch which cooperates with the module to prevent slippage of the module relative to the panel, thereby allowing forces applied to the module to be transferred through the latch to the panel.

SUMMARY OF THE INVENTION

An embodiment is directed to a latch for use with a panel mount module. The latch has a first housing and a second housing. The first housing has a first module receiving cavity with a first back wall and first side walls which extend from the first back wall. First securing projections extend from the first back wall into the first module receiving cavity. First mating members extend from the ends of the first side walls. The second housing has a second module receiving cavity with a second back wall and second side walls which extend from the second back wall. Second securing projections extend from the second back wall into the second module receiving cavity. Second mating members extend from the ends of the second side walls. The first mating members and the second mating members are joined together to form the latch in which the first modular receiving cavity and the second modular receiving cavity are aligned to receive the panel mount module therein. The first securing projections and the second securing projections are positioned in openings of the panel mount module to secure the panel mount module relative to the latch when the first mating members and the second mating members are joined together.

An embodiment is directed to a latch for use with mounting a panel mount module to a panel. The latch includes a housing with a module receiving cavity. The module receiving cavity has cavity walls with projections extending from the cavity walls into the module receiving cavity. The projections are configured to be positioned in openings provided in side walls of the module when the latch is mounted on the module. Securing openings extend through the housing. Mounting hardware is positioned in the securing openings. The securing openings and mounting hardware are configured to be positioned in line with mounting openings in the pane. With the mounting hardware properly secured in the mounting openings of the panel and the projections properly secured in the openings of the module, the module is prevented from movement relative to the panel and any forces applied to the module will be transferred through the latch to the panel.

An embodiment is directed to a method of securing a module to a panel. The method includes: positioning projections of a latch mechanism in securing openings of the module; tightening mounting hardware which extend through the latch mechanism to cause the mounting hardware to engage a surface of the panel; moving engagement shoulders of the projections of the latch mechanism to engage engagement surfaces of the securing openings of the module as the mounting hardware is tightened; and moving the latch mechanism and the module away from the surface of the panel as the mounting hardware is tightened. With the mounting hardware fully tightened, the movement of the module relative to the panel is prevented and forces applied to the module are transferred through the latch mechanism to the panel.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 1:
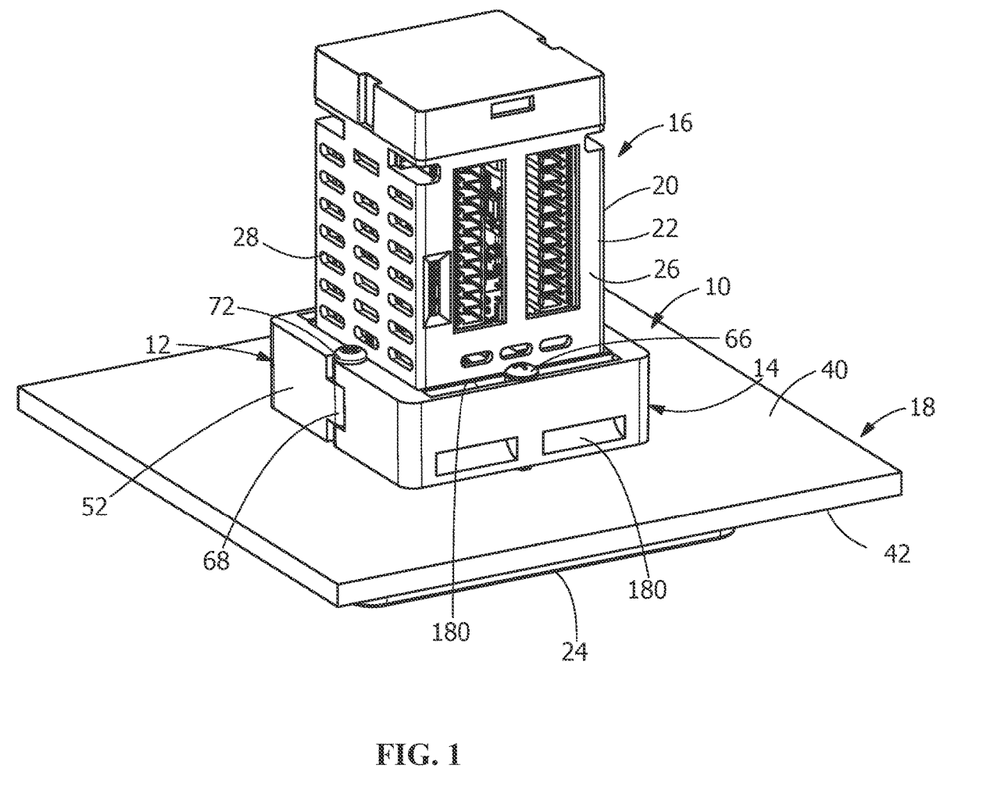
FIG. 1 is a back, bottom perspective view of an illustrative latching mechanism according to the present invention positioned on a module and a panel to maintain the module in position on the panel.
Figure 2:
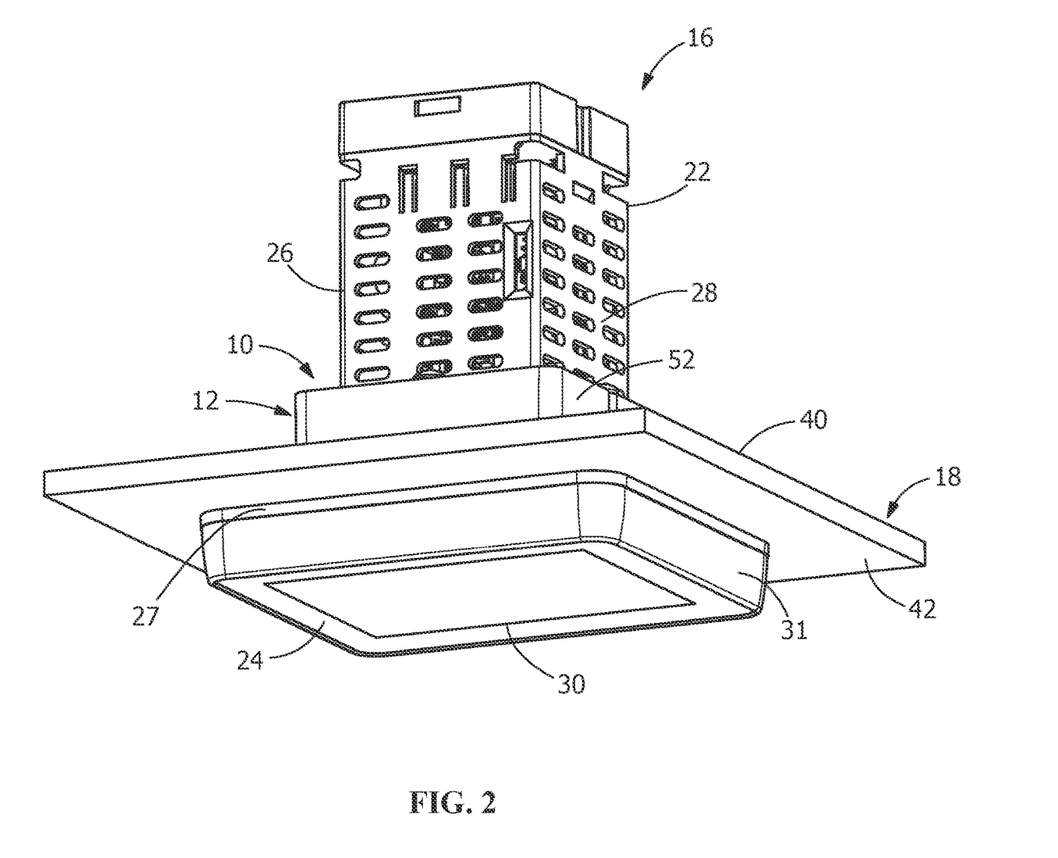
FIG. 2 is a front, top perspective view FIG. 1.
Figure 3:
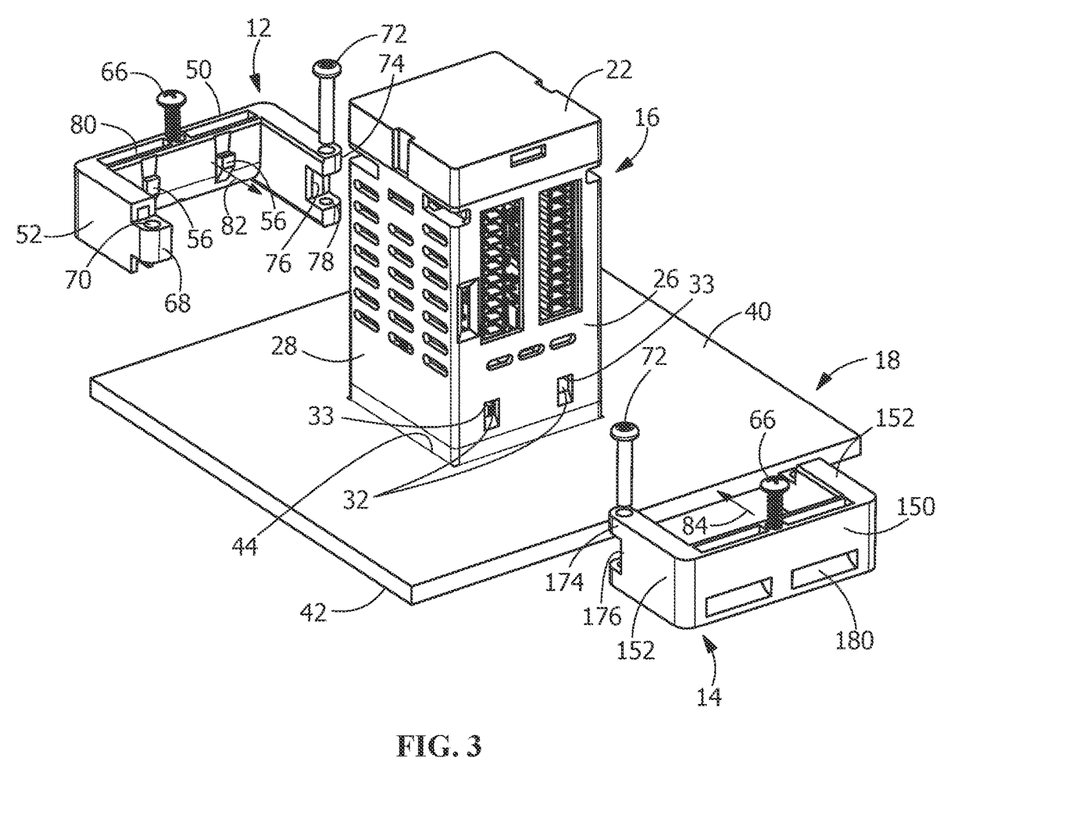
FIG. 3 is a back, bottom perspective view similar to FIG. 1 with the latching mechanism and mounting hardware exploded from the module and the panel.

Referring to FIGS. 1 through 3, a latch mechanism 10 having a first latch or housing 12 and a second latch or housing 14 is shown. The latch mechanism 10 is used to secure a module 16 to a panel 18. The module 16 may by any type of connector or interface, such as, but not limited to, a human machine interface. The panel 18 may be, but is not limited, to an enclosure panel.

Figure 8:
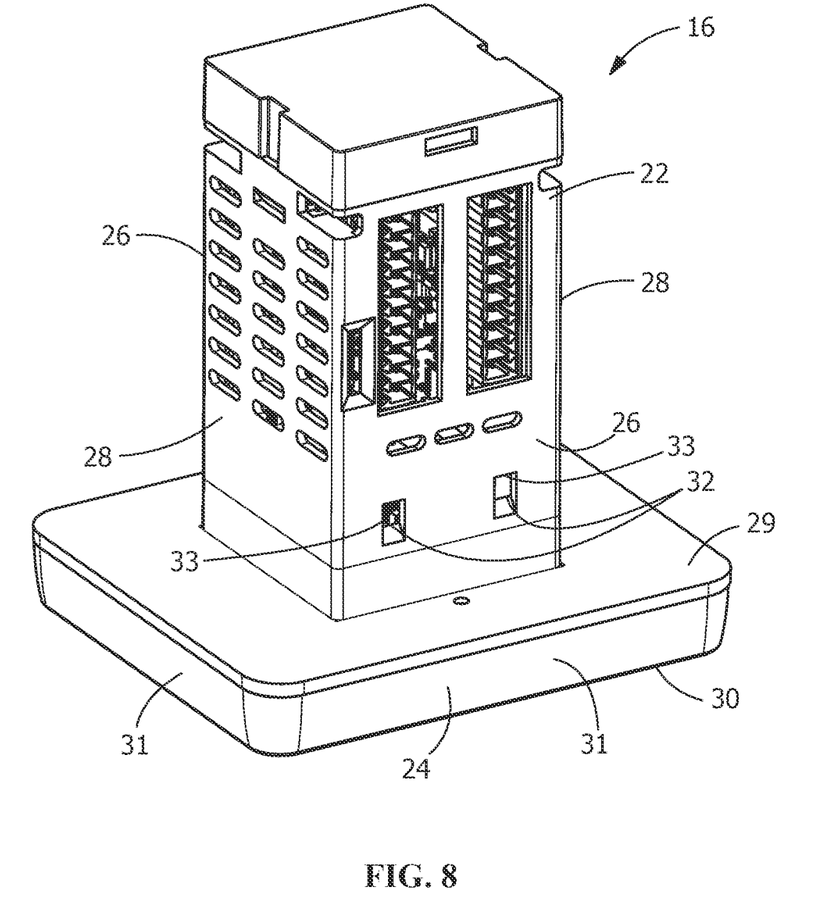
FIG. 8 is a back bottom perspective of the illustrative module of FIG. 1.
Figure 9:
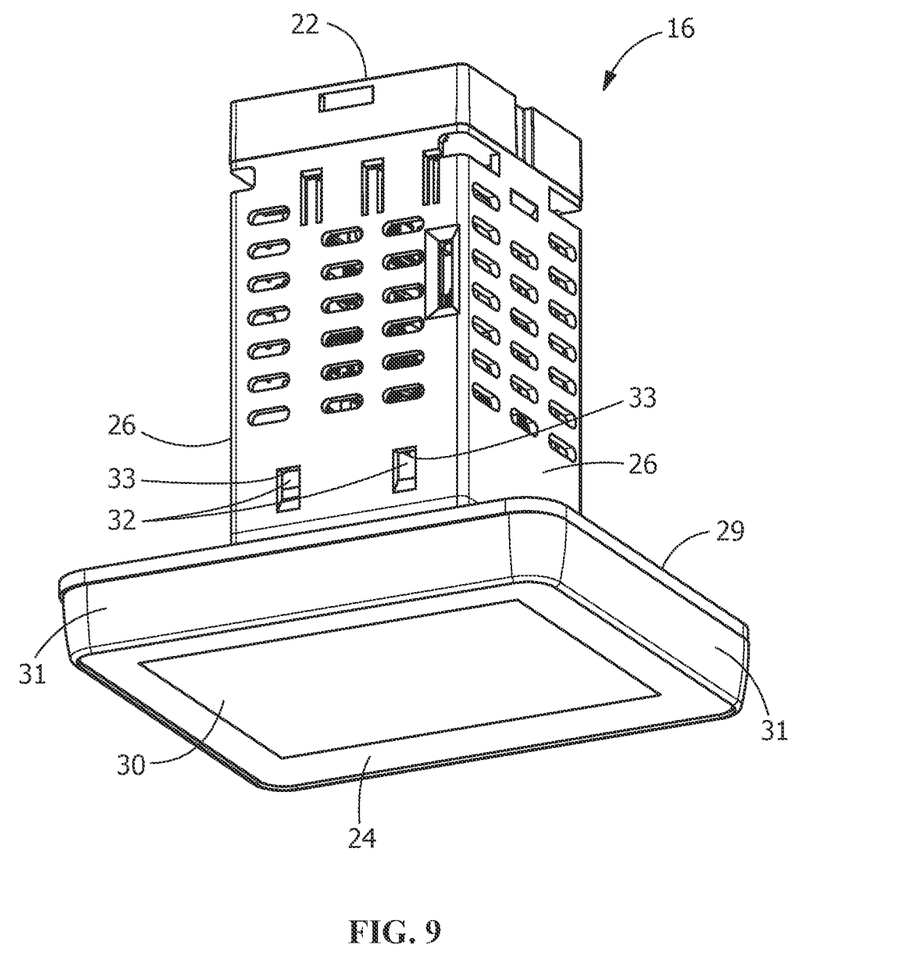
FIG. 9 is a front, top perspective of the illustrative module of FIG. 1.

In the illustrative embodiment shown in FIGS. 8 and 9, the illustrative module 16 has host casing or housing 20 with an upper portion 22, a bottom portion 24. The upper portion 22 has side surfaces 26 and end surfaces 28 which extend between the side surfaces 26. The bottom portion 24 has a top surface 29 and an oppositely facing bottom surface 30. Side walls 31 extend between the top surface 29 and the bottom surface 30. The upper portion 22 extends from the top surface 29 of the bottom portion 24. The top surface 29 extends beyond the periphery of the side surfaces 26 and end surfaces 28 of the upper portion 22.

Securing openings or cavities 32 are provided on each side surface 26 of the upper portion 22 of the housing 20. In the illustrative embodiment shown, two securing openings 32 are provided in each side surface 26. However, the number and positioning of the securing openings 32 may vary. In various embodiments, one or more securing openings 32 may be provided only on one respective side surface 26.

Each securing opening or cavity 32 has a top engagement shoulder or surface 33 which extends inward from the side surface 26. The engagement surface 33 extends in a direction which is essentially perpendicular to the side surface 26.

As shown in FIGS. 1 through 3, the illustrative panel 18 has a first surface 40 and an oppositely facing second surface 42. A module receiving opening 44 extends through the first surface 40 and the second surface 42.

Figure 4:
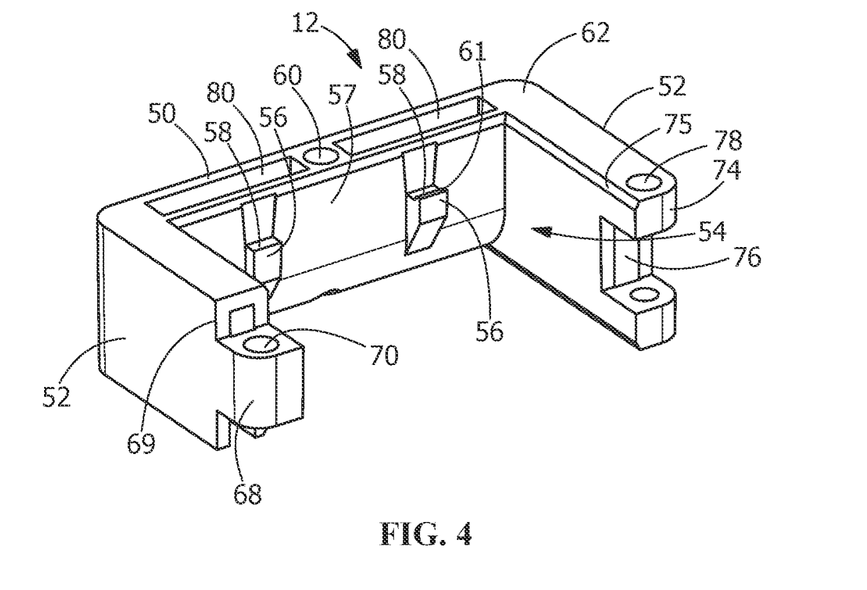
FIG. 4 is a top, front perspective of a first illustrative latch member of the latching mechanism.
Figure 5:
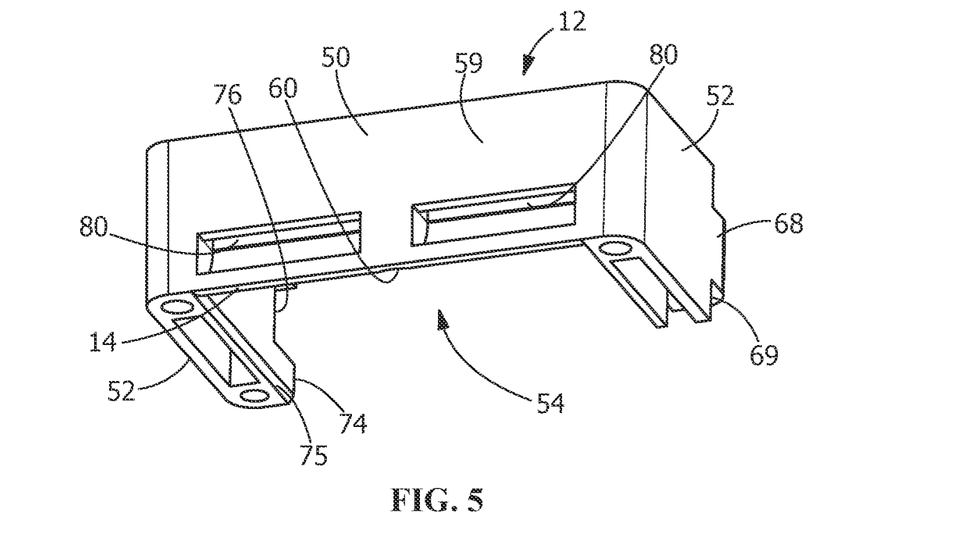
FIG. 5 is a back, bottom perspective of the latch member of FIG. 4.

As shown in FIGS. 4 and 5, the first latch or housing 12 has a back wall 50 and side walls 52 which extend from either end of the back wall 50. The back wall 50 and side walls 52 form a C-shaped first housing 12. A first module receiving cavity 54 extends between the back wall 50 and the side walls 52.

Securing projections 56 are positioned on an inwardly facing surface 57 of the back wall 50 and extend into the first module receiving cavity 54. In the illustrative embodiment shown, two securing projections 56 are provided on the back wall 50. However, the number and positioning of the securing projections 56 may vary. The securing projections 56 are configured and positioned to engage respective securing openings 32 on a respective side surface 26 of the module 16.

In the illustrative embodiment shown, the securing projections 56 have engagement shoulders 58 which are approximately perpendicular to the plane of the back wall 50. A securing projection 61 extends from one engagement shoulder 58. The securing projection 61 is configured to engage a recess (not shown) in a respective securing opening 32 to positively secure the housing 12 to the module 16.

A mounting opening 60 extends through the back wall 50 from a top surface 62 of the back wall 50 to a bottom surface 64. The mounting opening 60 is configured to receiving mounting hardware 66 (such as, but not limited to, a screw) therein. Although only one mounting opening 60 is shown, other numbers of mounting openings 60 may be provided without departing from the scope of the invention.

A mating member or projection 68 extends from a free end 69 of one of the side walls 52. The mating projection 68 extends from the side wall 52 in a direction away from the back wall 50. An opening 70 extends through the mating projections 68. The opening 70 is configured to receive mating hardware 72 (such as, but not limited to, a screw) therein.

Mating members or projections 74 are provided at the free end 75 of the other side wall 52. The mating projections 74 extend from the side wall 52 in a direction away from the back wall 50. Openings 78 extend through the mating projections 74. The openings 78 are configured to receive the mating hardware 72 therein. The mating projections 74 and the free end 75 of the side wall 52 define a mating recess 76.

Wire receiving openings 80 extend through the back wall 50. In the illustrative embodiment shown two wire receiving openings 80 are provided, with one wire receiving opening 80 provided on either side of the mounting opening 60. The wire receiving openings 80 extend from the top surface 62 of the back wall 50 to an outwardly facing surface 59 of the back wall 50. The wire receiving openings 80 are dimensioned to receive wires (not shown) which extend from the module 16. The receiving openings 80 are configured to provide means of strain relief to the wires.

Figure 6:
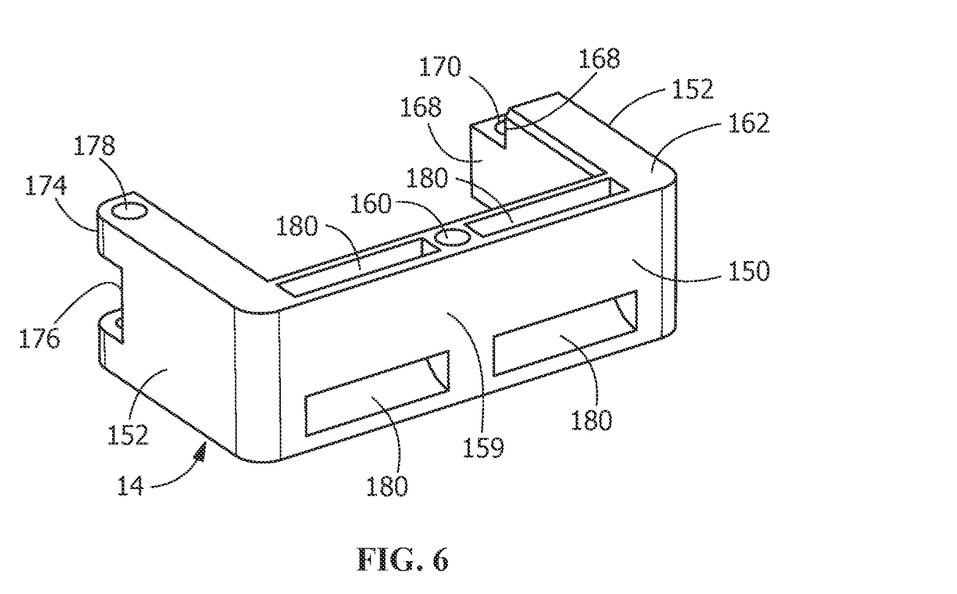
FIG. 6 is a back, top perspective of a second illustrative latch member of the latching mechanism.
Figure 7:
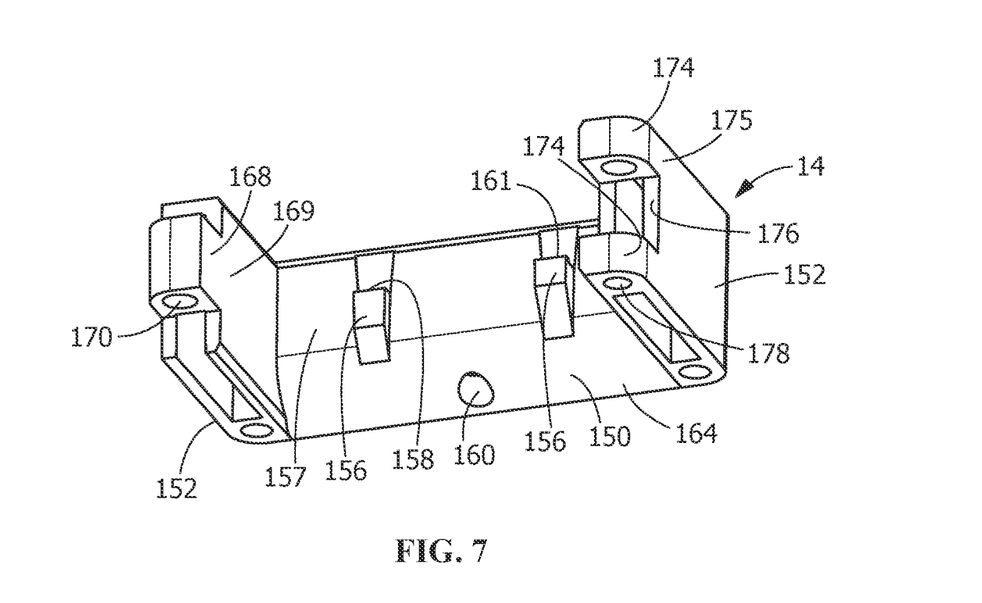
FIG. 7 is a front, bottom perspective of the latch member of FIG. 6.

As shown in FIGS. 6 and 7, the second latch or housing has a back wall 150 and side walls 152 which extend from either end of the back wall 150. The back wall 150 and side walls 152 form a C-shaped second housing 14. A second module receiving cavity 154 extends between the back wall 150 and the side walls 152. In the illustrative embodiment shown, the second housing 14 is symmetrical to the first housing 12, but other configurations of the first housing 12 and the second housing 14 may be used.

Securing projections 156 are positioned on an inwardly facing surface 157 of the back wall 150 and extend into the second module receiving cavity 154. In the illustrative embodiment shown, two securing projections 156 are provided on the back wall 150. However, the number and positioning of the securing projections 156 may vary. The securing projections 156 are configured and positioned to engage respective securing openings 32 on a respective side surface 26 of the module 16.

In the illustrative embodiment shown, the securing projections 156 have engagement shoulders 158 which are approximately perpendicular to the plane of the back wall 150. A securing projection 161 extends from one engagement shoulder 158. The securing projection 161 is configured to engage a recess (not shown) in a respective securing opening 32 to move positively secure the housing 14 to the module 16.

A mounting opening 160 extends through the back wall 150 from a top surface 162 of the back wall 150 to a bottom surface 164. The mounting opening 160 is configured to receiving mounting hardware 66 (such as, but not limited to, a screw) therein. Although only one mounting opening 160 is shown, other numbers of mounting openings 160 may be provided without departing from the scope of the invention.

A mating member or projection 168 extends from a free end 169 of one of the side walls 152. The mating projection 168 extends from the side wall 152 in a direction away from the back wall 150. An opening 170 extends through the mating projections 168. The opening 170 is configured to receive mating hardware 172 (such as, but not limited to, a screw) therein.

Mating members or projections 174 are provided at the free end 175 of the other side wall 152. The mating projections 174 extend from the side wall 152 in a direction away from the back wall 150. Openings 178 extend through the mating projections 174. The openings 178 are configured to receive the mating hardware 72 therein. The mating projections 174 and the free end 175 of the side wall 152 define a mating recess 176.

Wire receiving openings 180 extend through the back wall 150. In the illustrative embodiment shown two wire receiving openings 180 are provided, with one wire receiving opening 180 provided on either side of the mounting opening 160. The wire receiving openings 180 extend from the top surface 162 of the back wall 150 to an outwardly facing surface 159 of the back wall 150. The wire receiving openings 180 are dimensioned to receive wires (not shown) which extend from the module 16. The receiving openings 180 are configured to provide means of strain relief to the wires.

In use, the upper portion 22 of the module 16 is inserted through the module receiving opening 44 of the panel 18. The insertion of the module 16 continues until the top surface 29 of the bottom portion 24 of the module 16 engages the second surface 42 of the panel 18. As the top surface 29 of the bottom portion 24 of the module 16 is larger than the module receiving opening 44, the continued insertion of the module 16 through the panel 18 is prevented. A gasket 27 (FIG. 2) may be provided between the top surface 29 of the bottom portion 24 of the module 16 and the second surface 42 of the panel 18 to provide a seal between the top surface 29 of the bottom portion 24 of the module 16 and the second surface 42 of the panel 18.

In various embodiments, it is desired that the module 16 not have any slippage or movement relative to the panel 18. In order to prevent the unwanted slippage or movement, the latch mechanism 10 is assembled to the upper portion 22 of the module 16 and cooperates with the module 16 and panel 18 to secure the module 16 to the panel 18.

During assembly of the latch mechanism 10 to the bottom portion 24 of the module 16, the first latch or housing 12 is moved into engagement with the module 16, as represented by arrow 82 in FIG. 3. As this occurs, a portion of the module 16 is positioned in the first module receiving cavity 54. When fully inserted, the side walls 52 and the back wall 50 extend about the periphery of the portion of the module 16. The first module receiving cavity 54, the side walls 52 and the back wall 50 are dimensioned to proximate to or engage the respective side surface 26 and end surfaces 28 of the module 16, thereby preventing or limiting the movement between the module 16 relative to the first latch or housing 12.

As the first housing 12 is moved into engagement with the module 16, the securing projections 56 are aligned with the securing openings 32 of a respective side surface 36 of the module. The securing projections 56, which are positioned on the inwardly facing surface 57 of the back wall 50 and extend into the first module receiving cavity 54, are moved into the securing cavities 32 of the respective side surface 26 of the module.

During assembly of the latch mechanism 10 to the module 16, the second latch or housing 14 is moved into engagement with the module 16, as represented by arrow 84 in FIG. 3. As this occurs, a portion of the module 16 is positioned in the second module receiving cavity 154. When fully inserted, the side walls 152 and the back wall 150 extend about the periphery of the portion of the module 16. The second module receiving cavity 154, the side walls 152 and the back wall 150 are dimensioned to proximate to or engage the respective side surface 26 and end surfaces 28 of the module 16, thereby preventing or limiting the movement between the module 16 relative to the second latch or housing 14.

As the second housing 14 is moved into engagement with the module 16, the securing projections 156 are aligned with the securing openings 32 of a respective side surface 36 of the module. The securing projections 156, which are positioned on the inwardly facing surface 157 of the back wall 150 and extend into the second module receiving cavity 154, are moved into the securing cavities 32 of the respective side surface 26 of the module.

In addition, as the second housing 14 is moved into engagement with the module 16, the mating projection 168 of the side wall 152 of the second housing 14 is moved into the mating recess 76 of the side wall 52 of the first housing 12. When fully inserted, the mating projection 168 is positioned in the mating recess 76 between the mating projections 74. In this position, the opening 170 of the mating projection 168 and the openings 78 of the mating projections 74 are aligned. The mating hardware 72 is positioned in the opening 170 and the openings 78 to secure the mating projection 168 and the second housing 14 to the mating projections 74 and the first housing 12.

As the second housing 14 is moved into engagement with the module 16, the mating projection 68 of the side wall 52 of the first housing 12 is moved into the mating recess 176 of the side wall 152 of the second housing 14. When fully inserted, the mating projection 68 is positioned in the mating recess 176 between the mating projections 174. In this position, the opening 70 of the mating projection 68 and the openings 178 of the mating projections 174 are aligned. The mating hardware 72 is positioned in the opening 70 and the openings 178 to secure the mating projection 68 and the first housing 12 to the mating projections 174 and the second housing 14.

With the first housing 12 and the second housing 14 of the latch mechanism 10 properly positioned on the module 16 and joined or secured to each other, the first module receiving cavity 54 and the second module receiving cavity 154 form a module receiving cavity which extends about the entire periphery of the module 16. With the first housing and the second housing 14 secured to each other, the latch mechanism 10 is secured to the module 16. In this fully assembled or secure position, the latch mechanism 10 is prevented from movement relative to the module 16 in the x, y or z directions.

With the latch mechanism 10 properly secured to the module 16, the mounting hardware 66 is turned or tightened to be moved downward toward the first surface 40 of the panel 18. As this occurs, free ends of the mounting hardware 66 engages the first surface 40 of the panel 18. As continued downward movement of the mounting hardware 66 is prevented by the panel 18, continued turning of the mounting hardware 66 causes the mounting hardware 66 to move the first housing 12 and the second housing 14 of the latching mechanism 10 upward away from the panel 18.

As the latching mechanism 10 is moved upward away from the panel 18, the engagement shoulders 58, 158 and the securing projections 61, 161 engage the top engagement shoulders or surfaces 33 of the securing openings or cavities 32. As the turning of the mounting hardware 66 continues, the engagement shoulders 58, 158 and the securing projections 61, 161 apply forces to the top engagement shoulders or surfaces 33 of the securing openings or cavities 32. The forces are in a direction away from the first surface 40 of the panel 18. This causes the module 16 to be moved upward as viewed in FIG. 1 relative to the panel 18. As the module 16 is moved upward, the top surface 29 of the bottom portion 24 of the module 16 is moved toward the second surface 42 of the panel 18. As this occurs the gasket 27 is compressed between the top surface 29 of the bottom portion 24 of the module 16 and the second surface 42 of the panel 18 to provide a seal therebetween.

With the mounting hardware 66 properly tightened against the panel 18, the positioning of the securing projections 56, 156 in the securing openings or cavities 32 and the interaction of the engagement shoulders 58, 158 and the securing projections 61, 161 the securing projections 56, 156 and the top engagement shoulders or surfaces 33 of the securing openings or cavities 32 prevents the movement of the module 16 in a direction which is parallel or perpendicular to a longitudinal axis of the back wall 50. Any forces applied to the module 16 will, therefore, be transferred through the latch mechanism 10 to the panel 18.

In summary, the method of securing the module 16 to the panel 18 includes: positioning the projections 56, 156 of the latch mechanism 10 in securing openings 32 of the module 16; tightening mounting hardware 66, which extend through the latch mechanism 10, to cause the mounting hardware 66 to engage the first surface 40 of the panel 18; moving engagement shoulders 58, 158 of the projections 56, 156 of the latch mechanism 10 to engage the engagement surfaces 33 of the securing openings 32 of the module 16 as the mounting hardware 66 is tightened; and moving the latch mechanism 10 and the module 16 away from the first surface 40 of the panel 18 as the mounting hardware 66 is tightened by apply forces to the engagement surfaces 33 of the securing openings 32. With the mounting hardware 66 fully tightened, the movement of the module 16 relative to the panel 18 is prevented and forces applied to the module 16 are transferred through the latch mechanism 10 to the panel 18.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

We claim:

1. A latch for use with a panel mount module, the latch comprising:
   a first housing, the first housing having a first module receiving cavity, the first module receiving cavity having a first back wall and first side walls extending from the first back wall, first securing projections extending from the first back wall into the first module receiving cavity, first mating members extending from the ends of the first side walls, at least one first wire receiving opening extends through the first back wall of the first housing;
   a second housing, the second housing having a second module receiving cavity, the second module receiving cavity having a second back wall and second side walls extending from the second back wall, second securing projections extending from the second back wall into the second module receiving cavity, second mating members extending from the ends of the second side walls;
   the first mating members and the second mating members being joined together to form the latch with the first modular receiving cavity and the second modular receiving cavity being aligned to receive the panel mount module therein,
   wherein the first securing projections and the second securing projections being positioned in openings of the panel mount module to secure the panel mount module relative to the latch when the first mating members and the second mating members are joined together.

2. The latch as recited in claim 1, wherein the first securing projections have first engagement shoulders which are approximately perpendicular to the plane of the first back wall and the second securing projections have second engagement shoulders which are approximately perpendicular to the plane of the second back wall.

3. The latch as recited in claim 1, wherein a first mounting opening extends through the first back wall from a top surface of the first back wall to a bottom surface of the first back wall, the first mounting opening configured to receiving mounting hardware therein.

4. The latch as recited in claim 3, wherein a second mounting opening extends through the second back wall from a top surface of the second back wall to a bottom surface of the second back wall, the second mounting opening configured to receiving mounting hardware therein.

5. The latch as recited in claim 1, wherein the first housing has a first mating member extends from a free end of a first respective first side wall of the first side walls, the first mating member extends from the first respective first side wall in a direction away from the first back wall, a first opening extends through the first mating member and is configured to receive mating hardware therein.

6. The latch as recited in claim 5, wherein the first housing has first mating projections which are provided at a free end of a second respective first side wall of the first side walls, the first mating projections extend from the second respective first side wall in a direction away from the first back wall, second openings extend through the first mating projections and are configured to receive the mating hardware therein, the first mating projections define a first mating recess.

7. The latch as recited in claim 6, wherein the second housing has a second mating member extends from a free end of a first respective first side wall of the second side walls, the second mating member extends from the first respective first side wall of the second side walls in a direction away from the second back wall, a third opening extends through the second mating member and is configured to receive mating hardware therein, the second mating member is positioned in the first mating recess of the first housing.

8. The latch as recited in claim 7, wherein the second housing has second mating projections which are provided at a free end of a second respective second side wall of the second side walls, the second mating projections extend from the second respective second side wall of the second side walls in a direction away from the second back wall, fourth openings extend through the second mating projections and are configured to receive the mating hardware therein, the second mating projections define a second mating recess configured to receive the first mating member of the first housing.

9. The latch as recited in claim 1, wherein at least one second wire receiving opening extends through the second back wall of the second housing.

10. The latch as recited in claim 1, wherein the at least one first wire receiving opening extends from a top surface of the first back wall to an outwardly facing surface of the first back wall.

11. A latch for use with mounting a panel mount module to a panel, the latch comprising:
- a housing having a first housing member and a second housing member, the first and second housing members being mated together with mating hardware, the first and second housing members forming a module receiving cavity, the cavity having cavity walls with projections extending from the cavity walls into the module receiving cavity, the projections being configured to be positioned in openings provided in side walls of the module when the latch is mounted on the module, the projections having engagement shoulders which are approximately perpendicular to the plane of the cavity walls;
- securing openings extending through the first housing member and the second housing member, mounting hardware positioned in the securing openings;
- wherein with the mounting hardware properly positioned on the panel and the projections properly secured in the openings in the side walls of the module, the securing projections engage top engagement shoulders of the openings in the side walls of the module;
- wherein as the mounting hardware is turned, the engagement shoulders apply forces to the top engagement shoulders of the openings in the side walls of the module to prevent movement of the module relative to the panel and transfer any forces applied to the module through the latch to the panel.

12. The latch as recited in claim 11, wherein at least one mounting opening extends through the at least one cavity wall of the cavity walls from a top surface of the at least one cavity wall to a bottom surface of the at least one cavity wall, the at least one mounting opening configured to receiving mating hardware therein.

13. The latch as recited in claim 11, wherein the first housing member and the second first housing member are symmetrical.

14. The latch as recited in claim 11, wherein the first housing member has a mating member which cooperates with mating projections of the second housing member to properly position the first housing member relative to the second housing member, mating hardware cooperates with the mating member and the mating projections to secure the first housing member to the second housing member.

15. The latch as recited in claim 11, wherein at least one wire receiving opening extends through the housing, the wire receiving opening configured to provide strain relief to the wires extending from the module.

* * * * *